United States Patent
Li et al.

(10) Patent No.: US 11,502,274 B2
(45) Date of Patent: Nov. 15, 2022

(54) DISPLAY SUBSTRATE AND PREPARATION METHOD THEREOF, AND DISPLAY APPARATUS

(71) Applicants: Chongqing BOE Display Technology Co., Ltd., Chongqing (CN); BOE Technology Group Co., Ltd., Beijing (CN)

(72) Inventors: Jie Li, Beijing (CN); Huaisen Ren, Beijing (CN); Wei Xia, Beijing (CN)

(73) Assignees: Chongqing BOE Display Technology Co., Ltd., Chongqing (CN); Beijing BOE Technology Development Co., Ltd., Beijing (CN)

( * ) Notice: Subject to any disclaimer, the term of this patent is extended or adjusted under 35 U.S.C. 154(b) by 196 days.

(21) Appl. No.: 16/923,116

(22) Filed: Jul. 8, 2020

(65) Prior Publication Data

US 2021/0098743 A1 Apr. 1, 2021

(30) Foreign Application Priority Data

Sep. 29, 2019 (CN) .......................... 201910932118.0

(51) Int. Cl.
*H01L 51/52* (2006.01)
*H01L 27/32* (2006.01)
*H01L 51/56* (2006.01)

(52) U.S. Cl.
CPC ........ *H01L 51/5256* (2013.01); *H01L 27/322* (2013.01); *H01L 51/56* (2013.01); *H01L 27/3244* (2013.01); *H01L 2251/558* (2013.01)

(58) Field of Classification Search
CPC ... H01L 51/5256; H01L 27/322; H01L 27/32; H01L 51/5253
See application file for complete search history.

(56) References Cited

U.S. PATENT DOCUMENTS

| | | | | |
|---|---|---|---|---|
| 2014/0117842 A1* | 5/2014 | Hanamura | .......... | H01L 27/3248 313/504 |
| 2014/0367661 A1* | 12/2014 | Akagawa | ............ | H01L 51/5256 438/26 |
| 2016/0300888 A1 | 10/2016 | Wang et al. | | |
| 2018/0182818 A1* | 6/2018 | Kim | .................... | H01L 51/5284 |
| 2021/0183953 A1 | 6/2021 | Yu | | |

FOREIGN PATENT DOCUMENTS

| | | |
|---|---|---|
| CN | 103996696 A | 8/2014 |
| CN | 109309170 A | 2/2019 |
| CN | 109841661 A | 6/2019 |

OTHER PUBLICATIONS

Office Action dated Jun. 7, 2021 for Chinese Patent Application No. 201910932118.0 and English Translation.

* cited by examiner

*Primary Examiner* — Changhyun Yi
(74) *Attorney, Agent, or Firm* — Ling Wu; Stephen Yang; Ling and Yang Intellectual Property

(57) ABSTRACT

A display substrate includes a base substrate, a display structure layer arranged on the base substrate, a first encapsulation layer, a first protection layer, a color filter layer, a second protection layer and a second encapsulation layer sequentially superposed on the display structure layer. Also provided is a preparation method of a display substrate and a display apparatus.

17 Claims, 3 Drawing Sheets

DISPLAY SUBSTRATE AND PREPARATION METHOD THEREOF, AND DISPLAY APPARATUS

CROSS-REFERENCE TO RELATED APPLICATION

This application claims the priority of Chinese Patent Application No. 201910932118.0 filed to the CNIPA on Sep. 29, 2019, the entire content of which is hereby incorporated by reference.

TECHNICAL FIELD

The present disclosure relates to, but is not limited to, the field of display technology, in particular to a display substrate and a preparation method thereof, and a display apparatus.

BACKGROUND

At present, a Polarizer (POL) can effectively reduce a reflectivity of a display panel under strong light, but it loses lots of light, which greatly increases a burden of life for an Organic Light-Emitting Diode (OLED) display panel. Moreover, the Polarizer is thick and brittle, which is not conducive to the realization of flexible display characteristics such as folding and curling of the OLED display panel. As the polarizer has the above mentioned drawbacks, a color filter is currently used to replace the polarizer.

SUMMARY

The following is a summary of the subject matter described in detail in the present disclosure. This summary is not intended to limit the protection scope of the claims.

The present disclosure provides a display substrate, a preparation method thereof and a display apparatus.

In one aspect, the present disclosure provides a display substrate, including a base substrate, a display structure layer, and a first encapsulation layer, a first protection layer, a color filter layer, a second protection layer and a second encapsulation layer sequentially superposed on the display structure layer.

In another aspect, the present disclosure provides a display apparatus, including a display substrate. The display substrate includes a base substrate, a display structure layer, and a first encapsulation layer, a first protection layer, a color filter layer, a second protection layer and a second encapsulation layer sequentially superposed on the display structure layer.

In another aspect, the present disclosure provides a method for preparing a display substrate, including: forming a display structure layer on a base substrate; forming a first encapsulation layer on the display structure layer; forming a first protection layer on the first encapsulation layer; forming a color filter layer on the first protection layer; forming a second protection layer on the color filter layer; and forming a second encapsulation layer on the second protection layer.

Other aspects will become apparent upon reading and understanding the brief description of the drawings and embodiments of the present disclosure.

BRIEF DESCRIPTION OF DRAWINGS

Accompanying drawings are used to provide a further understanding of technical solutions of the present disclosure, form a part of the specification, and explain technical solutions of the present disclosure together with embodiments of the present disclosure, while they do not constitute a limitation on the technical solutions of the present disclosure.

DETAILED DESCRIPTION

Figure 1:
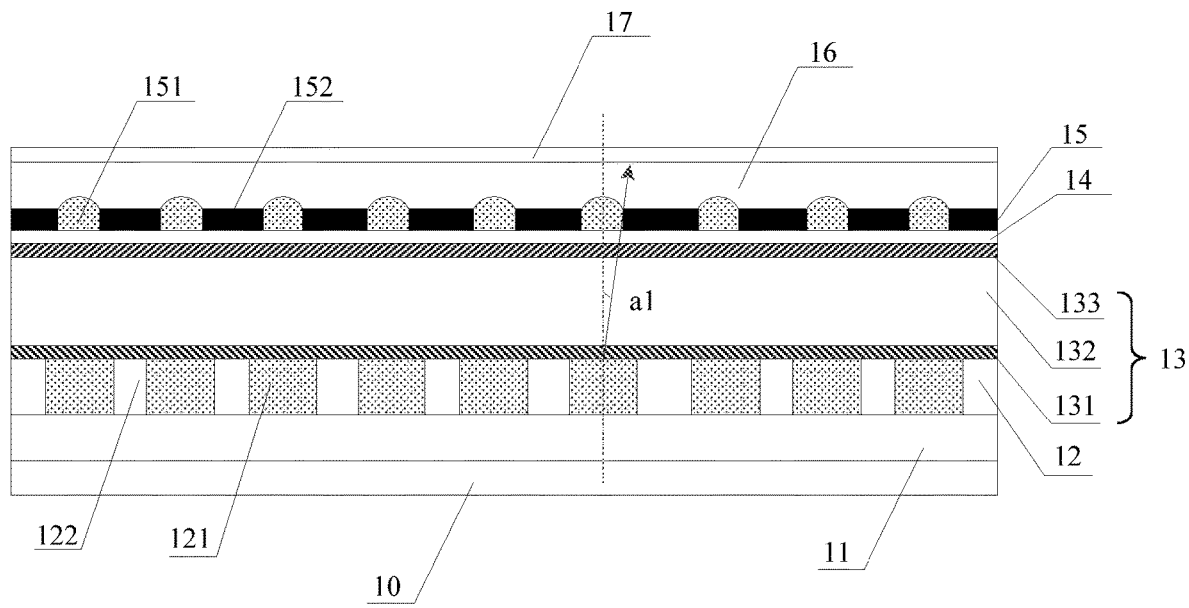
FIG. 1 is a schematic diagram of a structure of a display substrate.

The present disclosure describes a plurality of embodiments, but the description is exemplary rather than limiting, and it is obvious to those of ordinary skill in the art that there may be more embodiments and implementations within the scope of the embodiments described in the present disclosure. Although many possible combinations of features are shown in the drawings and discussed in embodiments, many other combinations of the disclosed features are also possible. Unless specifically limited, any feature or element of any embodiment may be used in combination with or may replace any other feature or element of any other embodiment.

The present disclosure includes and contemplates combinations of features and elements known to those of ordinary skill in the art. Embodiments, features and elements already disclosed in the present disclosure may also be combined with any conventional features or elements to form a unique inventive solution defined by the claims. Any features or elements of any embodiments may also be combined with features or elements from other inventions to form another unique invention defined by the claims. Therefore, it should be understood that any features shown or discussed in the present disclosure may be implemented individually or in any suitable combination. Therefore, embodiments are not limited except by the limitations according to the appended claims and their equivalents. In addition, one or more modifications and changes may be made within the scope of protection of the appended claims.

Furthermore, in describing representative embodiments, the specification may have presented a method or process as a specific sequence of steps. However, to the extent that the method or process does not depend on the specific order of steps described herein, the method or process should not be limited to the specific order of steps described. As one of ordinary skill in the art will understand, other sequences of steps are also possible. Therefore, the specific order of steps set forth in the specification should not be interpreted as limiting the claims. Furthermore, the claims for the method or process should not be limited to performing their steps in the written order, and those skilled in the art can easily understand that these orders can be varied and still remain within the spirit and scope of the embodiments of the present disclosure.

In the drawings, the size of a constituent element, or the thickness or area of a layer, is sometimes exaggerated for clarity. Therefore, an implementation of the present disclosure is not necessarily limited to the size shown, and the shape and size of one or more components in the drawings do not reflect true proportions. In addition, the drawings schematically show ideal examples, and an implementation of the present disclosure is not limited to the shapes or values shown in the drawings.

The "first", "second", "third" and other ordinal numbers in the present disclosure are used to avoid confusion of constituent elements, but not to limit in quantity.

The "about" in the present disclosure means that the limit is not strictly set, and a value within the range of process and measurement errors is allowed.

FIG. 1 is a schematic diagram of a structure of a display substrate. As shown in FIG. 1, the display substrate includes a base substrate 10, a display structure layer (including a driving array layer 11 and a light emitting structure layer 12) arranged on the base substrate 10, an encapsulation structure layer 13, a touch electrode layer 14, a color filter layer 15, a protection layer 16, and a cover plate 17.

The light emitting structure layer 12 includes a Pixel Definition Layer (PDL) 122 and a sub-pixel area 121 defined by the pixel definition layer 122. Each sub-pixel area 121 may include an anode layer, a hole transport layer, a light emitting layer, an electron transport layer, and a cathode layer, which are sequentially located from a side close to the drive array layer 11 to a side remote from the drive array layer 11.

The encapsulation structure layer 13 includes a first layer 131, a second layer 132, and a third layer 133 superposed from bottom to top. The first layer 131 and the third layer 133 are inorganic layers. For example, the following materials may be used: silicon oxide (SiOx), silicon nitride (SiNx), silicon oxynitride (SiON), etc., or high dielectric constant (High k) materials such as aluminum oxide (AlOx), hafnium oxide (HfOx), tantalum oxide (TaOx), etc. The second layer 132 is an organic layer, for example, acrylic, epoxy resin, silicone and other materials may be used. A thickness range of the first layer 131 is about 0.7 to 1.2 μm, a thickness range of the second layer 132 is about 10 to 14 μm, and a thickness range of the third layer 133 is about 0.5 to 1.0 μm.

The color filter layer 15 may include a Color Film (CF) layer 151 and a Black Matrix (BM) 152. The color film layer 151 includes a plurality of color films of different colors (e.g., red color films, green color films, and blue color films) which are arranged on a same layer and are sequentially and circularly arranged, and the black matrix 152 is arranged in a gap area between adjacent color films. The color film in the color film layer 151 corresponds to the sub-pixel area 121 in the light emitting structure layer 12, so that the light emitted from the sub-pixel area 121 can be emitted out through the corresponding color film.

In the display substrate shown in FIG. 1, a film thickness of the encapsulation structure layer 13 (especially the second layer 132) is relatively large, which is not conducive to the thinning of the display substrate, and is not conducive to the enhancement of the luminance decay (L-Decay) angle. However, if a film thickness of the second layer 132 is directly reduced, a leveling performance of the second layer 132 will inevitably deteriorate, resulting in problems such as uneven display luminance (also referred to as Mura) in some areas.

An embodiment of the present disclosure provides a display substrate, a preparation method thereof and a display apparatus. An embodiment provides a display substrate, including a base substrate, a display structure layer arranged on the base substrate, and a first encapsulation layer, a first protection layer, a color filter layer, a second protection layer and a second encapsulation layer sequentially superposed on the display structure layer. In the embodiment, the encapsulation structure layer shown in FIG. 1 is not adopted, but the first encapsulation layer, the first protection layer, the color filter layer, the second protection layer and the second encapsulation layer are sequentially superposed on the display structure layer, thereby forming a color film encapsulation structure with a double sandwich film layer design on the display structure layer. As a result, the encapsulation of the display structure layer and the color filter layer can be realized, which can improve the water and oxygen resistance of the display substrate. Moreover, a distance between the color filter layer and the light emitting structure layer can be reduced by adopting the color film encapsulation structure, thereby improving an L-Decay angle, reducing a film thickness of the display substrate, and reducing phenomena of a color separation caused by light diffraction at the openings of the black matrix and the pixel defining layer and a color cast caused by unequal propagation paths of lights in the color film.

It is easy to understand that luminance of the display substrate decays gradually as a viewing angle increases. The L-Decay angle may be understood as the viewing angle of the display substrate when the luminance of the display substrate decreases by a certain proportion (e.g., 50%) as the viewing angle increases. Therefore, when the luminance of the display substrate is maintained to be visible, the larger the viewing angle of the display substrate is, the larger the L-Decay angle is. In the embodiment, the color filter layer is made as close to the light emitting structure layer as possible to improve the viewing angle of the display substrate, thereby improving the L-Decay angle to a maximum extent.

The following describes the technical solution of the present disclosure through a plurality of exemplary embodiments.

Figure 2:
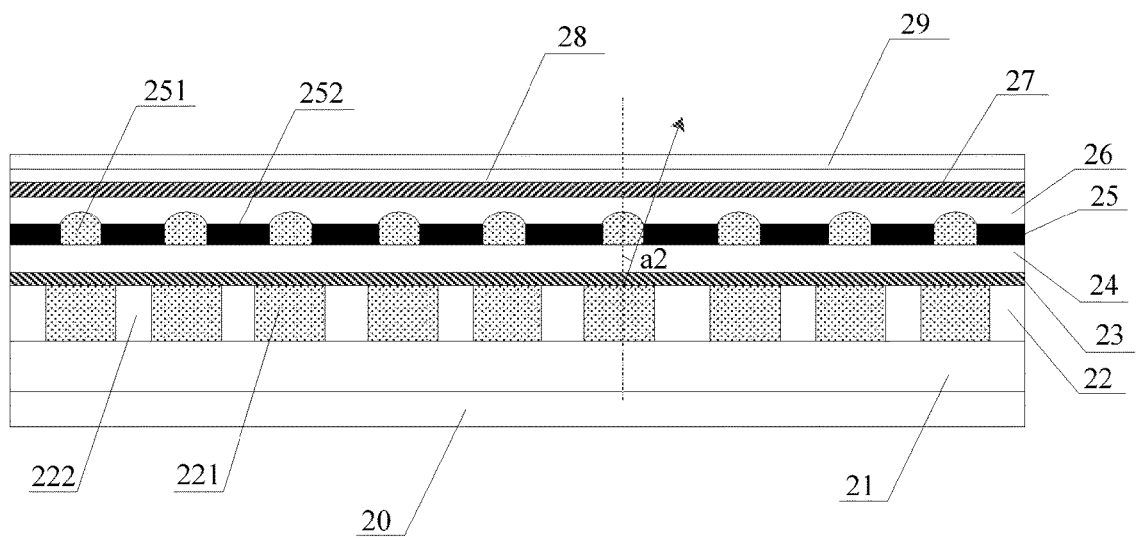
FIG. 2 is a schematic diagram of a structure of a display substrate according to at least one embodiment of the present disclosure.

FIG. 2 is a schematic diagram of a structure of a display substrate according to at least one embodiment of the present disclosure. As shown in FIG. 2, the display substrate provided in the embodiment may include a base substrate 20, a display structure layer arranged on the substrate 20, and there are sequentially superposed a first encapsulation layer 23, a first protection layer 24, a color filter layer 25, a second protection layer 26, and a second encapsulation layer 27 on the display structure layer. A material of the first encapsulation layer 23 and a material of the second encapsulation layer 27 may respectively be an inorganic material, and a material of the first protection layer 24 and a material of the second protection layer 26 may respectively be an organic material.

The first encapsulation layer 23 may provide an initial encapsulation for the display structure layer and the second encapsulation layer 27 may provide a secondary encapsulation. The first protection layer 24 may provide a planarization and serve as an underlay substrate for the color filter layer 25. The second protection layer 26 may protect the color filter layer 25.

The display structure layer may include a driving array layer 21 arranged on the base substrate 20 and a light emitting structure layer 22 arranged on the driving array layer 21. The driving array layer 21 may include functional structures such as a gate line, a data line, a power line, a driving transistor, a switching transistor, a storage capacitor, and the like. The light emitting structure layer 22 may be an OLED light emitting unit. The light emitting structure layer 22 may include: a pixel defining layer 222 and a sub-pixel area 221 defined by the pixel defining layer 222. Each sub-pixel area 221 may sequentially include an anode layer, a hole transport layer, a light emitting layer, an electron transport layer, and a cathode layer from a side close to the driving array layer 21 to a side remote from the driving array layer 21. However, the embodiment is not limited to this. In some examples, each sub-pixel area may sequentially include an anode layer, a light emitting layer, and a cathode layer from a side close to the driving array layer to a side away from the driving array layer.

In the embodiment, the encapsulation structure layer shown in FIG. 1 is not adopted, which can eliminate an adverse effect caused by using the encapsulation structure layer with excessive thickness. In the embodiment, the light emitting structure layer 22 and the color filter layer 25 are separated by only the first encapsulation layer 23 and the first protection layer 24, so a distance between the light emitting structure layer and the color filter layer is reduced when compared with the display substrate shown in FIG. 1, thereby increasing an L-Decay angle. As shown in FIGS. 1 and 2, the L-Decay angle a1 in FIG. 1 is significantly smaller than the L-Decay angle a2 in the embodiment.

The following further illustrates the technical solution of the embodiment by an example of the preparation process of the display substrate of the embodiment. A "patterning process" mentioned in the embodiment includes deposition of a film layer, coating of photoresist, mask exposure, development, etching, stripping of photoresist, etc., and is a known mature preparation process. The deposition may adopt known processes such as sputtering, evaporation, chemical vapor deposition, etc., the coating may adopt known coating processes, and the etching may adopt known methods, which are not limited here. In the description of the embodiment, it should be understood that "thin film" refers to a layer of thin film made of a certain material by deposition or other processes on the base substrate. If the "thin film" does not need a patterning process during the whole manufacturing process, the "thin film" can also be called a "layer". If the "thin film" needs a patterning process during the whole manufacturing process, it is called "thin film" before the patterning process and "layer" after the patterning process. The "layer" after the patterning process contains at least one "pattern".

In step (1), a driving array layer 21 and a light emitting structure layer 22 are sequentially formed on the base substrate 20. The light emitting structure layer 22 may include a pixel defining layer 222 and sub-pixel areas 221 defined by the pixel defining layer 222. An anode layer, a hole transport layer, a light emitting layer, an electron transport layer, and a cathode layer may be sequentially arranged in each sub-pixel area 221 from bottom to top.

The driving array layer 21 may include a gate line, a data line, a power line, a driving transistor, a switching transistor, a storage capacitor, and other functional structures. Taking the driving transistor of the driving array layer and one sub-pixel as an example, the preparation process of the driving array layer and the light emitting structure layer is illustrated. Forming a driving array layer on a base substrate may include: depositing a first insulating film and an active film on the base substrate sequentially, patterning the active film through a patterning process to form an active layer of the driving transistor; then, depositing a second insulating film and a first metal film sequentially, and patterning the first metal film and the second insulating film through a patterning process to form a second insulating layer and a gate electrode of the driving transistor; then, depositing a third insulating film, patterning the third insulating film through a patterning process to form a third insulating layer covering the above mentioned structures, and forming a plurality of via holes on the third insulating layer, wherein the via holes can expose the active layer; then, depositing the second metal film on the base substrate on which the above mentioned patterns are formed, and patterning the second metal film by a patterning process to form a source electrode and a drain electrode of the driving transistor on the third insulating layer, wherein the source electrode and the drain electrode can be respectively connected with the active layer through the via holes. The first insulating layer may be referred to as a buffer layer, the second insulating layer may be referred to as a gate insulating layer, and the third insulating layer may be referred to as an interlayer insulating layer. Forming the light emitting structure layer on the driving array layer may include: depositing a fourth insulating film on the driving array layer to form a fourth insulating layer covering the above mentioned structures, then coating a fifth insulating film, and etching the fourth insulating layer through mask, exposure and development by using the fifth insulating film as photoresist to form a fifth insulating layer covering the above mentioned structure, wherein the fourth insulating layer may be referred to as a passivation layer and the fifth insulating layer may be referred to as a flat layer; then, depositing a transparent conductive film on the base substrate on which the above mentioned patterns are formed, and patterning the transparent conductive film by a patterning process to form an anode layer; then, coating a pixel definition film on the base substrate on which the above mentioned patterns are formed, and forming a pixel definition layer through mask, exposure and development, wherein the pixel definition layer is provided with an opening exposing the anode layer, and forming a hole transport layer, a light emitting layer and an electron transport layer sequentially in the opening by vapor deposition or ink jet printing; then, forming a cathode layer on the base substrate on which the above mentioned patterns are formed by the vapor deposition.

In step (2), a first encapsulation layer 23 is formed on the light emitting structure layer 22. A first encapsulation film may be deposited on the light emitting structure layer 22 by CVD (Chemical Vapour Deposition) to form the first encapsulation layer 23 covering the light emitting structure layer 22. The first encapsulation layer 23 can provide an initial encapsulation for the light-emitting structure layer 22 to protect the light-emitting structure layer 22, effectively prevent moisture introduced during the subsequent preparation of the functional layer and moisture in the air from penetrating into the light-emitting structure layer 22, and protect the light-emitting structure layer 22 from infringement so as to maintain its performance.

The material of the first encapsulation film may include silicon nitride, silicon oxide, silicon oxynitride, titanium oxide, zirconium oxide, tantalum oxide, barium titanate, neodymium oxide, aluminum oxynitride, zirconium oxynitride, tantalum oxynitride, yttrium oxynitride or neodymium oxynitride, etc.

In step (3), a first protection layer 24 is formed on the first encapsulation layer 23. The first encapsulation layer 23 may be coated with a first protection Over Coat (OC) having a thickness ranging from about 2 to 4 microns (μm) to form the first protection layer 24. The first protection layer 24 can provide planarization and can also protect the first encapsulation layer 23 as an underlay substrate for the color filter layer 25.

The material of the first protection film may include, but is not limited to, polysiloxane-based material, acrylic-based material, polyimide-based material, and the like.

In step (4), a color filter layer 25 is formed on the first protection layer 24. The color filter layer 25 may include a color film layer 251 and a black matrix 252. The color film layer 251 may include a plurality of color films of different colors (e.g., red color films, green color films, and blue color films) arranged on the same layer and arranged sequentially and circularly, and the black matrix 252 may be arranged in a gap area between adjacent color films. The color film in the color film layer 251 may correspond to the sub-pixel area 221 in the light emitting structure layer 22 so that a light emitted from the sub-pixel area 221 is emitted through the corresponding color film.

In this step, a black pigment or a black chromium (Cr) film is coated on the first protection layer 24, and the black pigment or the black chromium film is patterned by a patterning process to form a pattern of the black matrix 252. Then, color films corresponding to RGB three colors are sequentially formed. Taking the formation of a red color film as an example, the first protection layer on which a black matrix has been formed is coated with a red pigment, and after baking and curing, the red color film is formed by mask exposure and development. The formation process of the green color film and the blue color film is similar, so it will not be repeated here.

In step (5), a second protection layer 26 is formed on the color filter layer 25. The color filter layer 25 is coated with a second protection film with a thickness ranging from 2 to 4 μm, and a pattern of the second protection layer 26 covering the color filter layer 25 is formed by mask exposure and development. The second protection layer 26 can protect the color filter layer 25, and can extend a path of water vapor entering the display substrate, further improving the water and oxygen resistance of the display substrate.

The material of the second protection film may include, but is not limited to, polysiloxane-based material, acrylic-based material, polyimide-based material, and the like.

In step (6), a second encapsulation layer 27 is formed on the second protection layer 26. The second encapsulation film may be deposited on the second protection layer 26 by CVD to form the second encapsulation layer 27 covering the second protection layer 26. The second encapsulation layer 27 can encapsulate the display substrate for a second time to protect the color filter layer 25 and the light emitting structure layer 22 and prevent water vapor from entering the display substrate.

The material of the second encapsulation film may include, but is not limited to, silicon nitride, silicon oxide, silicon oxynitride, titanium oxide, zirconium oxide, tantalum oxide, barium titanate, neodymium oxide, aluminum oxynitride, zirconium oxynitride, tantalum oxynitride, yttrium oxynitride or neodymium oxynitride, etc.

In step (7), a touch electrode layer 28 is formed on the second encapsulation layer 27. For example, TSP (Touch-Screen Panel) may be attached to the second encapsulation layer 27 by an adhesive, which may be, for example, Pressure Sensitive Adhesive (PSA); or, the touch electrode layer can be directly prepared on the second encapsulation layer 27, for example, by using FMLOC (Flexible Multi-Layer On Cell) technology.

In step (8), a cover plate 29 is arranged on the touch electrode layer 28. The cover plate 29 may be located above the touch electrode layer 28 and may be placed opposite the base substrate 20 to form the display substrate.

The display substrate provided by the embodiment adopts a double sandwich film layer design in which protection layers and encapsulation layers are respectively arranged on both sides of the color filter layer. Compared with the film layer structure on the display structure layer shown in FIG. 1, a thickness of the color film encapsulation structure provided by the embodiment can be reduced to about one third of the thickness before, a thickness of the whole film layer can be greatly reduced, and a defect caused by the excessive thickness of the encapsulation structure layer can be reduced. In addition, by adopting the color film encapsulation structure provided by the embodiment, a distance between the color filter layer and the light emitting structure layer can be reduced, so that a L-Decay angle is increased, the film thickness of the display substrate is reduced, and phenomena such as color separation phenomenon caused by light diffraction at the opening of the black matrix and the opening of the pixel defining layer and color cast caused by unequal propagation paths of light in the color film can be reduced.

Figure 3:
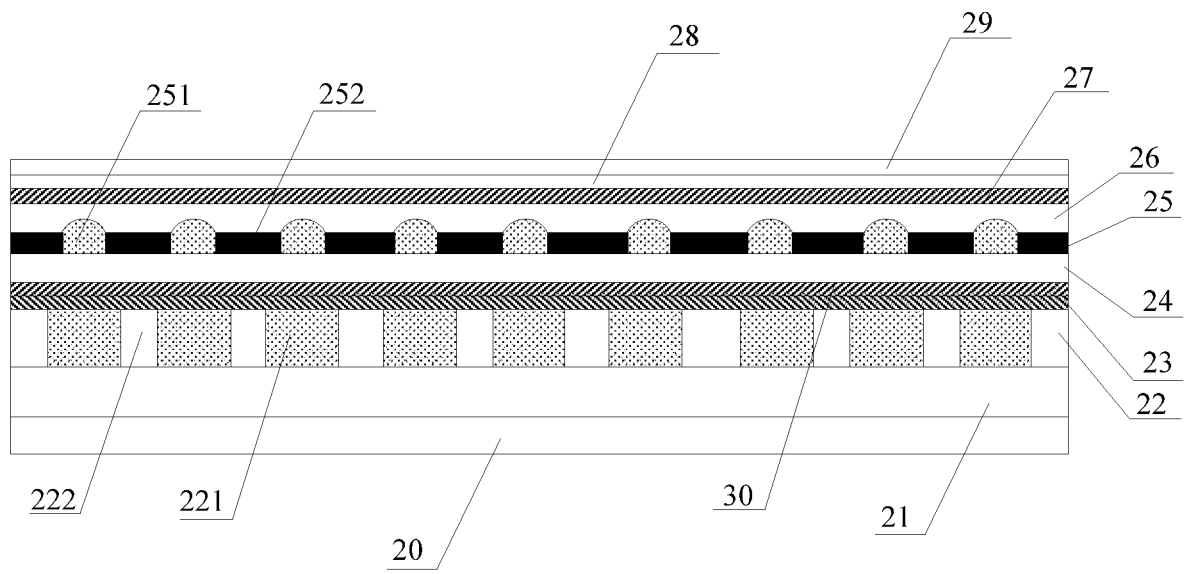
FIG. 3 is a schematic diagram of a structure of a display substrate according to at least one embodiment of the present disclosure.

FIG. 3 is a schematic diagram of a structure of a display substrate according to at least one embodiment of the present disclosure. In the display substrate of the embodiment, a third encapsulation layer 30 is added, compared with the display substrate shown in FIG. 2, and the third encapsulation layer 30 may be located between the first encapsulation layer 23 and the first protection layer 24.

The preparation process of the display substrate of the embodiment is basically the same as that of the previous embodiment, with the following differences. After step (2), the preparation method of the display substrate of the embodiment may further include: forming the third encapsulation layer 30 on the first encapsulation layer 23. A third encapsulation film may be deposited on the first encapsulation layer 23 by CVD to form the third encapsulation layer 30 covering the first encapsulation layer 23. The material of the third encpasulation film may include a material such as silicon nitride, silicon oxide, silicon oxynitride, titanium oxide, zirconium oxide, tantalum oxide, barium titanate, neodymium oxide, aluminum oxynitride, zirconium oxynitride, tantalum oxynitride, yttrium oxynitride or neodymium oxynitride, etc.

In addition, in step (3), a first protection layer 24 may be formed on the third encapsulation layer 30.

In the embodiment, the light-emitting structure layer 22 is initially encapsulated by the double-layer structure of the first encapsulation layer 23 and the third encapsulation layer 30, which can improve an effect of encapsulation, effectively prevent moisture introduced during the subsequent preparation of the functional layer and moisture in the air from penetrating into the light-emitting structure layer 22, and protect the light-emitting structure layer 22 from infringement without degrading its performance.

The embodiment can also achieve the following effects: a defect caused by an excessive thickness of the encapsulation structure layer is reduced; a distance between the color filter layer and the light emitting structure layer is reduced, so that a L-Decay angle is improved, a film thickness of the display substrate is reduced, and phenomena such as color separation phenomenon caused by light diffraction caused by openings of a black matrix and openings of a pixel defining layer and color cast caused by unequal propagation paths of light in the color film can be reduced.

Figure 4:
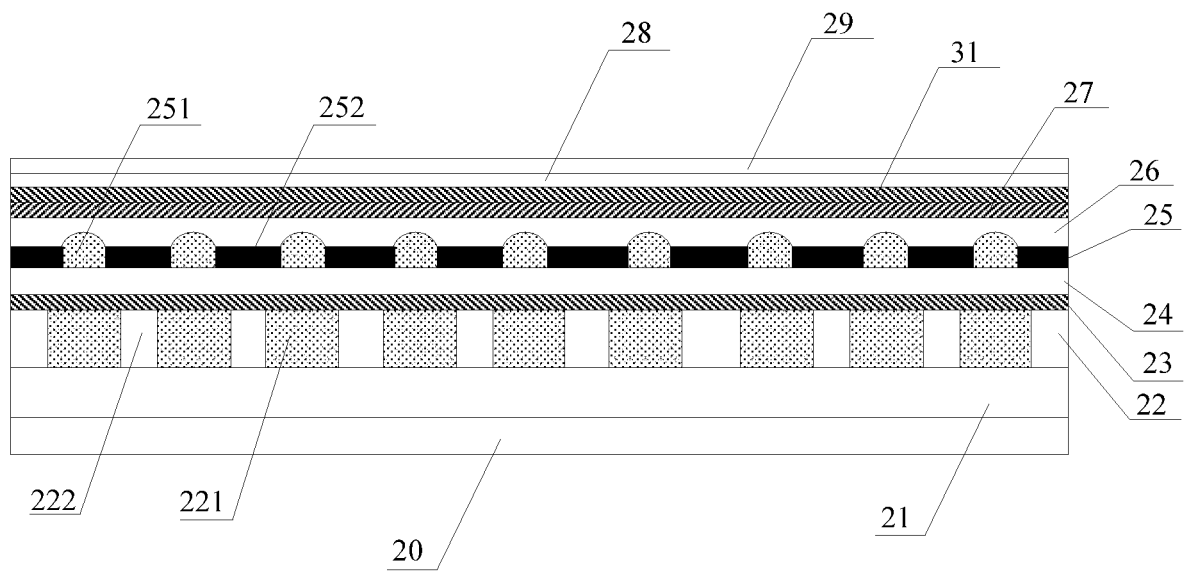
FIG. 4 is a schematic diagram of a structure of a display substrate according to at least one embodiment of the present disclosure.

FIG. 4 is a schematic diagram of a structure of a display substrate according to at least one embodiment of the present disclosure. In the display substrate of the embodiment, a fourth encapsulation layer 31 on the second encapsulation layer 27 is added, compared with the display substrate shown in FIG. 2.

The preparation process of the display substrate of the embodiment is basically the same as that of the previous embodiment, with the following differences. After step (6), the display substrate of the embodiment may further include: forming the fourth encapsulation layer 31 on the second encapsulation layer 27. A fourth encapsulation film may be deposited on the second encapsulation layer 27 by CVD to form the fourth encapsulation layer 31 covering the second encapsulation layer 27. The material of the fourth encapsulation film may include a material such as silicon nitride, silicon oxide, silicon oxynitride, titanium oxide, zirconium oxide, tantalum oxide, barium titanate, neodymium oxide, aluminum oxynitride, zirconium oxynitride, tantalum oxynitride, yttrium oxynitride or neodymium oxynitride, etc.

In addition, in step (7), a touch electrode layer 28 may be formed on the fourth encapsulation layer 31.

In the embodiment, the light emitting structure layer 22 is encapsulated for the second time by the double-layer structure of the second encapsulation layer 27 and the fourth encapsulation layer 31, which can improve an effect of encapsulation and further improve water and oxygen resistance of the display substrate.

The embodiment can also achieve the following effects: a defect caused by an excessive thickness of the encapsulation structure layer is reduced; a distance between the color filter layer and the light emitting structure layer is reduced, so that an L-Decay angle is improved, a film thickness of the display substrate is reduced, and phenomena such as color separation phenomenon caused by light diffraction caused by openings of a black matrix and openings of a pixel defining layer and color cast caused by unequal propagation paths of light in the color film can be reduced.

Figure 5:
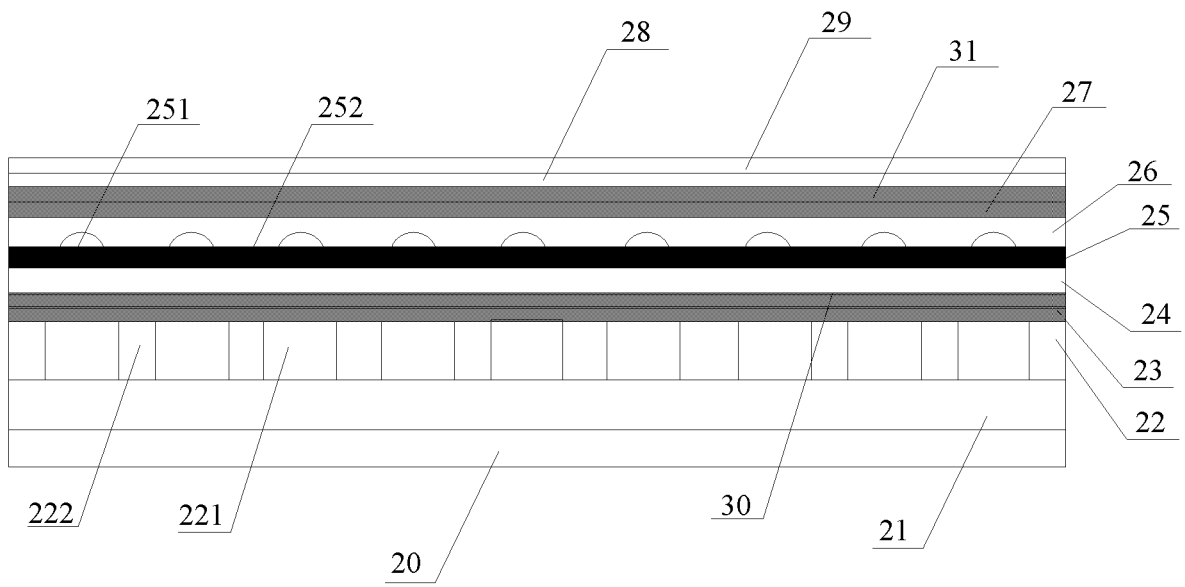
FIG. 5 is a schematic diagram of a structure of a display substrate according to at least one embodiment of the present disclosure.

FIG. 5 is a schematic diagram of a structure of a display substrate according to at least one embodiment of the present disclosure. The embodiment is an extension of the previous first embodiment. In the display substrate of the embodiment, a third encapsulation layer 30 and a fourth encapsulation layer 31 are added, compared with the display substrate shown in FIG. 2. The third encapsulation layer 30 may be located between the first encapsulation layer 23 and the first protection layer 24, and the fourth encapsulation layer 31 may be located on the second encapsulation layer 27.

The preparation process of the display substrate of the embodiment is basically the same as that of the previous embodiment, with the following differences. After step (2), the preparing process of the display substrate of the embodiment may further include: forming the third encapsulation layer 30 on the first encapsulation layer 23. A third encapsulation film may be deposited on the first encapsulation layer 23 by CVD to form the third encapsulation layer 30 covering the first encapsulation layer 23. The material of the third packaging film may include a material such as silicon nitride, silicon oxide, silicon oxynitride, titanium oxide, zirconium oxide, tantalum oxide, barium titanate, neodymium oxide, aluminum oxynitride, zirconium oxynitride, tantalum oxynitride, yttrium oxynitride or neodymium oxynitride, etc.

In step (3), the first protection layer 24 may be formed on the third encapsulation layer 30.

After step (6), the preparing process of the display substrate of the embodiment may further include: forming the fourth encapsulation layer 31 on the second encapsulation layer 27. A fourth encapsulation film may be deposited on the second encapsulation layer 27 by CVD to form the fourth encapsulation layer 31 covering the second encapsulation layer 27. The material of the fourth encapsulation film may include a material such as silicon nitride, silicon oxide, silicon oxynitride, titanium oxide, zirconium oxide, tantalum oxide, barium titanate, neodymium oxide, aluminum oxynitride, zirconium oxynitride, tantalum oxynitride, yttrium oxynitride or neodymium oxynitride, etc.

In step (7), a touch electrode layer 28 may be formed on the fourth encapsulation layer 31.

In the embodiment, the light-emitting structure layer 22 is initially encapsulated by the double-layer structure of the first encapsulation layer 23 and the third encapsulation layer 30, and the light-emitting structure layer 22 is then encapsulated for the second time by the double-layer structure of the second encapsulation layer 27 and the fourth encapsulation layer 31, so that water and oxygen resistance of the display substrate can be further improved.

The embodiment can also achieve the following effects: a defect caused by an excessive thickness of the encapsulation structure layer is reduced; a distance between the color filter layer and the light emitting structure layer is reduced, so that an L-Decay angle is improved, a film thickness of the display substrate is reduced, and phenomena such as color separation phenomenon caused by light diffraction caused by openings of a black matrix and openings of a pixel defining layer and color cast caused by unequal propagation paths of light in the color film can be reduced.

An embodiment of the present disclosure also provides a method for preparing a display substrate to prepare the display substrate of the previous embodiments.

Figure 6:
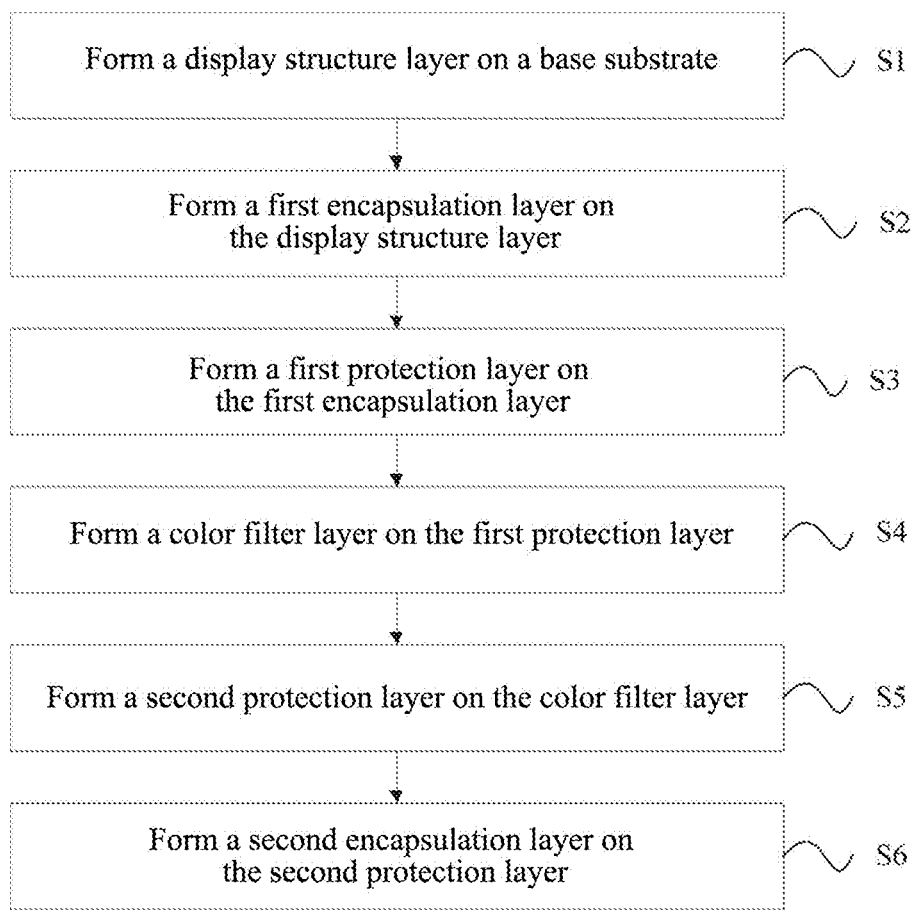
FIG. 6 is a flowchart of a method for preparing a display substrate according to at least one embodiment of the present disclosure.

FIG. 6 is a flowchart of a method for preparing a display substrate according to at least one embodiment of the present disclosure. As shown in FIG. 6, the method for preparing the display substrate provided in the embodiment may include steps S1 to S6. In step S1, a display structure layer is formed on a base substrate; in step S2, a first encapsulation layer is formed on the display structure layer; in step S3, a first protection layer is formed on the first encapsulation layer; in step S4, a color filter layer is formed on the first protection layer; in step S5, a second protection layer is formed on the color filter layer; and in step S6, a second encapsulation layer is formed on the second protection layer.

In an exemplary embodiment, the preparation method of the embodiment may further include: forming a third encapsulation layer between the first encapsulation layer and the first protection layer.

In an exemplary embodiment, the preparation method of the embodiment may further include: forming a fourth encapsulation layer on the second encapsulation layer.

In some exemplary embodiments, the preparation method of the embodiment may further include: forming a touch electrode layer on the fourth encapsulation layer.

In an exemplary embodiment, the preparation method of the embodiment may further include: forming a touch electrode layer on the second encapsulation layer.

In some exemplary embodiments, a thickness of the first protection layer may be in the range of about 2 to 4 microns, and a thickness of the second protection layer may be in the range of about 2 to 4 microns.

In some exemplary embodiments, a material of the first encapsulation layer and a material of the second encapsulation layer may respectively be an inorganic material, and a material of the first protective layer and a material of the second protective layer may respectively be an organic material.

The preparation process of the display substrate has been described in detail in the previous embodiments and will not be repeated here.

An embodiment of the present disclosure also provides a display apparatus, including the display substrate. In some exemplary embodiments, the display apparatus may be any product or component with a display function such as a mobile phone, a tablet computer, a television, a display, a notebook computer, a digital photo frame, a navigator, etc.

In the description of the present disclosure, it should be noted that the orientation or positional relationship indicated by the terms "upper", "lower", "one side", "other side", "one end", "other end", "side", "relative", "four corners", "periphery", "mouth" structure" and the like is based on the orientation or positional relationship shown in the drawings, only for convenience of describing the present disclosure and simplifying the description, and not to indicate or imply that the indicated structure has a specific orientation, is constructed or operates in a specific orientation, and therefore cannot be understood as a limitation of the present disclosure.

In the description of embodiments of the present disclosure, the terms "connection", "direct connection", "indirect connection", "fixed connection", "installation" and "assembly" are to be understood broadly, for example, they may be fixed connection, or they may be detachable connection, or they may be integrally connected, unless explicitly specified and limited otherwise. The terms "installation", "connection" and "fixed connection" may be directly connected, or may be indirectly connected through an intermediate medium, or may be an internal connection between two elements. Those of ordinary skill in the art can understand the specific meanings of the above mentioned terms in the present disclosure according to specific situations.

Although implementations disclosed in the present disclosure are as the above described, the contents are only implementations for facilitating understanding the present disclosure and are not used to limit the present disclosure. Any person skilled in the field to which the present disclosure pertains can make any modifications and variations in the forms and details of implementation without departing from the spirit and the scope disclosed in the present disclosure, but the patent protection scope of the present disclosure should still be subject to the scope defined by the appended claims.

What we claim is:

1. A display substrate, comprising:
   a base substrate, a display structure layer arranged on the base substrate, and a first encapsulation layer, a first protection layer, a color filter layer, a second protection layer and a second encapsulation layer sequentially superposed on the display structure layer, thereby forming a color film encapsulation structure with a double sandwich film layer design on the display structure layer;
   wherein a material of the first encapsulation layer and a material of the second encapsulation layer are respectively an inorganic material, and a material of the first protection layer and a material of the second protection layer are respectively an organic material.

2. The display substrate according to claim 1, further comprising: a third encapsulation layer located between the first encapsulation layer and the first protection layer.

3. The display substrate according to claim 1, further comprising a touch electrode layer located on the second encapsulation layer.

4. The display substrate according to claim 1, wherein a thickness of the first protection layer is in a range of about 2 to 4 microns, and a thickness of the second protection layer is in a range of about 2 to 4 microns.

5. The display substrate according to claim 1, further comprising: a fourth encapsulation layer located on the second encapsulation layer.

6. A display apparatus comprising a display substrate, wherein the display substrate comprises: a base substrate, a display structure layer arranged on the base substrate, and a first encapsulation layer, a first protection layer, a color filter layer, a second protection layer, and a second encapsulation layer sequentially superposed on the display structure layer, thereby forming a color film encapsulation structure with a double sandwich film layer design on the display structure layer;
   wherein a material of the first encapsulation layer and a material of the second encapsulation layer are respectively an inorganic material, and a material of the first protection layer and a material of the second protection layer are respectively an organic material.

7. The display apparatus according to claim 6, wherein the display substrate further comprises a third encapsulation layer located between the first encapsulation layer and the first protection layer.

8. The display apparatus according to claim 6, wherein the display substrate further comprises a touch electrode layer located on the second encapsulation layer.

9. The display apparatus according to claim 6, wherein a thickness of the first protection layer is in a range of about 2 to 4 microns, and a thickness of the second protection layer is in a range of about 2 to 4 microns.

10. The display apparatus according to claim 6, wherein the display substrate further comprises a fourth encapsulation layer located on the second encapsulation layer.

11. The display apparatus according to claim 6, wherein the display apparatus is an organic light emitting diode (OLED) display apparatus; and the display structure layer comprises a driving array layer and a light emitting structure layer arranged on the driving array layer, wherein the light emitting structure layer is an OLED light emitting unit, and the light emitting structure layer comprises a pixel defining layer and sub-pixel areas defined by the pixel defining layer.

12. The display apparatus according to claim 11, wherein the color filter layer comprises a color film layer and a black matrix, the color film layer comprises a plurality of color films of different colors arranged on a same layer and arranged sequentially and circularly, and the black matrix is arranged in a gap area between adjacent color films;
   the color film in the color film layer corresponds to the sub-pixel area in the light emitting structure layer, to make a light emitted from the sub-pixel area be emitted through the corresponding color film.

13. A preparation method of a display substrate, comprising:
   forming a display structure layer on a base substrate;
   forming a first encapsulation layer on the display structure layer;
   forming a first protection layer on the first encapsulation layer;
   forming a color filter layer on the first protection layer;

forming a second protection layer on the color filter layer; and forming a second encapsulation layer on the second protection layer, thereby forming a color film encapsulation structure with a double sandwich film layer design on the display structure layer;

wherein a material of the first encapsulation layer and a material of the second encapsulation layer are respectively an inorganic material, and a material of the first protection layer and a material of the second protection layer are respectively an organic material.

14. The preparation method according to claim 13, further comprising: forming a third encapsulation layer between the first encapsulation layer and the first protection layer.

15. The preparation method according to claim 13, further comprising: forming a fourth encapsulation layer on the second encapsulation layer.

16. The preparation method of claim 13, further comprising: forming a touch electrode layer on the second encapsulation layer.

17. The preparation method of claim 13, wherein a thickness of the first protection layer is in a range of about 2 to 4 microns, and a thickness of the second protection layer is in a range of about 2 to 4 microns.

* * * * *